US006819194B2

(12) United States Patent
Toncich et al.

(10) Patent No.: US 6,819,194 B2
(45) Date of Patent: Nov. 16, 2004

(54) TUNABLE VOLTAGE-CONTROLLED TEMPERATURE-COMPENSATED CRYSTAL OSCILLATOR

(75) Inventors: Stanley S. Toncich, San Diego, CA (US); Tim Forrester, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 168 days.

(21) Appl. No.: 10/120,596

(22) Filed: Apr. 9, 2002

(65) Prior Publication Data

US 2002/0149434 A1 Oct. 17, 2002

Related U.S. Application Data

(60) Provisional application No. 60/283,093, filed on Apr. 11, 2001.

(51) Int. Cl.[7] .................................................. H03B 5/32
(52) U.S. Cl. ...................................... 331/158; 331/176
(58) Field of Search ................................. 331/158, 176, 331/66, 116 R, 116 FE, 108 C, 108 D, 177 V, 179

(56) References Cited

U.S. PATENT DOCUMENTS

| 3,413,543 A | | 11/1968 | Schubring et al. | |
|---|---|---|---|---|
| 3,569,795 A | * | 3/1971 | Gikow | ........................ 361/434 |
| 3,676,803 A | | 7/1972 | Simmons | |
| 3,678,305 A | | 7/1972 | Paige | |
| 3,836,874 A | | 9/1974 | Maeda et al. | |
| 3,918,012 A | | 11/1975 | Peuzin | |
| 4,475,108 A | | 10/1984 | Moser | |
| 4,484,157 A | * | 11/1984 | Helle et al. | ............. 331/116 R |
| 4,733,328 A | | 3/1988 | Blazej | |
| 4,799,066 A | | 1/1989 | Deacon | |
| 4,835,499 A | | 5/1989 | Pickett | |

(List continued on next page.)

FOREIGN PATENT DOCUMENTS

| DE | 40 36 866 A1 | 7/1991 |
|---|---|---|
| EP | 0 637 131 A1 | 2/1995 |
| EP | 0 638 953 A1 | 2/1995 |
| EP | 0 680 108 A1 | 4/1995 |
| EP | 0 795 922 A1 | 9/1997 |
| EP | 0 843 374 A2 | 5/1998 |
| EP | 0 881 700 A1 | 5/1998 |
| EP | 0 909 024 A2 | 4/1999 |
| EP | 1 043 741 A2 | 10/2000 |
| JP | 2001338839 | 12/2001 |
| WO | WO 94/13028 | 6/1994 |
| WO | WO 00/28613 | 5/2000 |
| WO | WO 00/35042 | 6/2000 |
| WO | WO 00/62367 | 10/2000 |
| WO | WO 00/79645 A1 | 12/2000 |
| WO | WO 00/79648 A1 | 12/2000 |

OTHER PUBLICATIONS

A. Presser, "Varactor–Tunable, High–Q Microwave Filter," RCA Review, vol. 42, Dec. 1981, pp. 691–705.
C. Chang and T. Itoh, "Microwave Active Filters Based on Coupled Negative Resistance Method," IEEE Transactions on Microwave Theory and Techniques, vol. 38, No. 12, Dec. 1990, pp. 1879–1884.
P. Katzin, B. Bedard, Y. Ayasli, "Narrow–Band MMIC Filters with Automatic Tuning and Q–Factor Control," 1993 IEEE MTT–S Digest pp. 403–406.

(List continued on next page.)

Primary Examiner—Robert Pascal
Assistant Examiner—Joseph Chang

(57) ABSTRACT

A crystal oscillator having tunable ferroelectric components. A first ferroelectric capacitor is coupled to an automatic frequency control line for fine tuning the reference frequency. A second ferroelectric capacitor is coupled to temperature compensation control circuitry that applies a correction voltage to the second capacitor to vary the reference frequency in response to ambient temperature changes. A third ferroelectric capacitor has a capacitance that is adjusted and fixed during manufacture to set the initial tolerance of the crystal oscillator at ambient temperature.

16 Claims, 3 Drawing Sheets

U.S. PATENT DOCUMENTS

| | | | |
|---|---|---|---|
| 5,166,857 A | | 11/1992 | Avanic et al. |
| 5,212,463 A | | 5/1993 | Babbitt et al. |
| 5,216,392 A | | 6/1993 | Fraser et al. |
| 5,307,033 A | | 4/1994 | Koscica et al. |
| 5,427,988 A | | 6/1995 | Sengupta et al. |
| 5,450,092 A | | 9/1995 | Das |
| 5,472,935 A | * | 12/1995 | Yandrofski et al. ......... 505/210 |
| 5,496,795 A | | 3/1996 | Das |
| 5,557,286 A | | 9/1996 | Varadan |
| 5,561,407 A | | 10/1996 | Koscica et al. |
| 5,589,845 A | | 12/1996 | Yandrofski et al. |
| 5,617,104 A | | 4/1997 | Das |
| 5,640,042 A | | 6/1997 | Koscica et al. |
| 5,729,239 A | | 3/1998 | Rao |
| 5,777,524 A | | 7/1998 | Wojewoda et al. |
| 5,778,308 A | | 7/1998 | Sroka et al. |
| 5,880,921 A | | 3/1999 | Tham et al. |
| 5,945,887 A | | 8/1999 | Makino et al. |
| 5,973,567 A | | 10/1999 | Heal et al. |
| 5,973,568 A | | 10/1999 | Shapiro et al. |
| 5,986,515 A | * | 11/1999 | Sakurai ...................... 331/176 |
| 5,987,314 A | | 11/1999 | Saito |
| 6,028,561 A | | 2/2000 | Takei |
| 6,049,726 A | | 4/2000 | Gruenwald et al. |
| 6,052,036 A | | 4/2000 | Enstrom et al. |
| 6,097,263 A | | 8/2000 | Mueller et al. |
| 6,160,524 A | | 12/2000 | Wilber |
| 6,198,441 B1 | | 3/2001 | Okabe et al. |
| 6,292,143 B1 | | 9/2001 | Romanofsky |
| 6,294,964 B1 | * | 9/2001 | Satoh ..................... 331/116 R |
| 6,333,719 B1 | | 12/2001 | Varadan |

OTHER PUBLICATIONS

B. Hopf, I. Wolff, M.Guglielmi, "Coplanar MMIC Active Bandpass Filters Using Negatlive Resistance Circuits," 1994 IEEE MTT–S Digest pp. 1183–1185.

U. Karacaoglu and I. D. Robertson, "High Selectivity Varactor–Tuned MMIC Bandpass Filter Using Lossless Active Resonators," 1994 IEEE MTT–S Digest, pp. 1191–1194.

B. Nauta, "A CMOS Transconductance–C Filter Technique for Very High Frequencies," IEEE Journal of Solid–State Circuits, vol. 27, No. 2, Feb. 1992, pp. 142–153.

K. Fujita, H. Itoh, R. Yamamoto, "A 15.6 GHz Commercially Based 1/8 GaAs Dynamic Prescaler," 1989 IEEE GaAs IC Symposium, pp. 113–116.

J. Smuk, P. Katzin, "MMIC Phase Locked L–S Band Oscillators," 1994 GaAs IC Symposium Digest, pp. 27–29.

S. R. Chandler, I. C. Hunter, J. G. Gardiner, "Active Varactor Tunable Bandpass Filter," IEEE Microwave and Guided Wave Letters, vol. 3, No. 3, Mar. 1993.

I. C. Hunter, J. D. Rhodes, "Electronically Tunable Microwave Bandpass Filters," IEEE Transactions on Microwave Theory Techniques, vol. MTT–30, No. 9, Sep. 1982, pp. 1354–1367.

S. Toyoda, "Quarter–Wavelength Coupled Variable Bandstop and Bandpass Filter Using Varactor Diodes," IEEE Transactions on Microwave Theory and Techniques, vol. MTT–30, No. 9, Sep. 1982, pp. 1387–1389.

B. Yu. Kapilevich, "Variety of Approaches to Designing Microwave Active Filters," Proc. 27th European Microwave Conf., Jerusalem, vol. 1, 1997, pp. 397–408.

B. Kapilevich, "Understand the Operation of Channelized Active Filters," Microwaves & RF, Jan. 1997, pp. 89–92.

M. Dishall, "Alignment and Adjustment of Synchronously Tuned Multiple–Resonant–Circuit Filters," Proceedings of the IRE 39, Nov. 1951, pp. 1448–1455.

S. Cohn, "Dissipation Loss in Multiple–Coupled–Resonator Filters," Proceedings of the IRE 47, Aug. 1959, pp. 1342–1348.

G. L. Matthaei, "An Electronically Tunable Up–Convertor," Proceedings of the IRE 49, Nov. 1961, pp. 1703–1704.

E. G. Fubini, E. A. Guillemin, "Minimum Insertion Loss Filters," Proceedings of the IRE 47, Jan. 1959, pp. 37–41.

W. J. Getsinger, "Prototypes for Use in Broadbanding Reflection Amplifiers," IEEE Transactions on Microwave Theory and Techniques, PTGMTT–11, Nov. 1963, pp. 486–497.

E. S. Kuh, M. Fukada, "Optimum Synthesis of Wide–Band Parametric Amplifiers and Converters," IRE Transactions on Circuit Theory, PCCT–8, Dec. 1961, pp. 410–415.

W. J. Getsinger, G. L. Matthaei, "Some Aspects of the Design of Wide–Band Up–Converters and Nondegenerate Parametric Amplifiers," IEEE Transactions on Microwave Theory and Techniques, PTGMTT–12, Jan. 1964, pp. 77–87.

R. L. Sleven, "Design of a Tunable Multi–Cavity Waveguide Band–Pass Filter," 1959 IRE National Convention Record, Part 3, pp. 91–112.

J. J. Taub, B. F. Bodner, "Design of Three–Resonator Dissipative Band–Pass Filters Having Minimum Insertion Loss," Proceedings of the IRE 45, May 1957, pp. 681–687.

K. L. Kotzebue, "Broadband Electronically–Tuned Microwave Filters," 1960 IRE Wescon Convention Record, Part 1, pp. 21–27.

J. P. Louhos, I. Pankinaho, "Electrical Tuning of Integrated Mobile Phone Antennas," Nokia Mobile Phones, Sep. 15, 1999, pp. 69–97.

P. K. Panayi, M. Al–Nuaimi, L. P. Ivrissimtzis, "Tuning Techniques for the Planar Inverted–F Antenna," National Conference on Antennas and Propagation Publication, No. 461, Apr. 1999, pp. 259–262.

Satoshi Makioka et al, "A High Efficiency GaAs MCM Power Amplifier for 1.9GHz Digital Cordless Telephones," IEE 1994 Microwave and Millimeter–Wave Monolithic Circuits Symposium, 1994, pp. 51–54.

V. K. Varadan, K. A. Jose, V. V. Varadan, "Design and Development of Electronically Tunable Microstrip Antennas," IOP Publishing Ltd., 1999, pp. 238–242.

Communication Relating to the Results of the Partial International Search: PCT/IB 02/01077 (2002).

International Search Report: PCT/IB 02/01086 (Jun. 24, 2002).

International Search Report: PCT/IB 02/01078 (Jul. 10, 2002).

International Search Report: PCT/IB01087 (Jul. 19, 2002).

International Search Report: PCT/IB 02/01107 (Jul. 11, 2002).

International Search Report: PCT/IB 02/01120 (Jul. 11, 2002).

International Search Report: PCT/IB 02/01098 (Jul. 4, 2002).

International Search Report: PCT/IB 02/01082 (Jul. 8, 2002).

International Search Report: PCT/IB 02/01144 (Jul. 12, 2002).

International Search Report: PCT/IB 02/01026 (Jun. 28, 2002).

International Search Report: PCT/IB 02/01027 (Jun. 25, 2002).

* cited by examiner

TUNABLE VOLTAGE-CONTROLLED TEMPERATURE-COMPENSATED CRYSTAL OSCILLATOR

CROSS-REFERENCE TO RELATED APPLICATIONS

This application claims the benefit of U.S. Provisional Application 60/283,093, filed Apr. 11, 2001, which is hereby incorporated by reference. In addition, this application relates to the following U.S. applications, which are hereby incorporated by reference: Ser. No. 09/904,631 filed on Jul. 13, 2001, by Stanley S. Toncich entitled "Ferro-Electric Tunable Filter"; Ser. No. 09/912,753 filed on Jul. 24, 2001 by Stanley S. Toncich entitled "Tunable Ferro-Electric Multiplexer"; Ser. No. 09/927,732 filed on Aug. 8, 2001, by Stanley S. Toncich entitled "Low Loss Tunable Ferro-Electric Device and Method of Characterization"; Ser. No. 09/927,136 filed on Aug. 10, 2001, by Stanley S. Toncich entitled "Tunable Matching Circuit"; Ser. No. 10/044,522 filed on Jan. 11, 2002, by Stanley S. Toncich entitled "Tunable Planar Capacitor"; Ser. No. 10/077,654 filed on Feb. 14, 2002, by Stanley S. Toncich entitled "Tunable Isolator Matching Circuit"; Ser. No. 10/076,171 filed on Feb. 12, 2002, by Stanley S. Toncich entitled "Antenna Interface Unit"; Ser. No. 10/075,896 filed Feb. 12, 2002, by Stanley S. Toncich entitled "Tunable Antenna Matching Circuit"; Ser. No. 10/075,727 filed Feb. 12, 2002, by Stanley S. Toncich and Tim Forrester entitled "Tunable Low Noise Amplifier"; Ser. No. 10/075,507 filed on Feb. 12, 2002, by Stanley S. Toncich entitled "Tunable Power Amplifier Matching Circuit".

FIELD OF THE INVENTION

The present invention relates generally to tunable electronic devices and components and, more particularly, to crystal oscillators incorporating tunable ferroelectric components.

BACKGROUND OF THE INVENTION

Radio frequency bandwidth is a scarce resource that is highly valued and is becoming increasingly congested. Ever-increasing numbers of users are attempting to co-exist and to pass ever-increasing amounts of information through the finite amount of bandwidth that is available. The radio spectrum is divided into frequency bands that are allocated for specific uses. In the United States, for example, all FM radio stations transmit in the 88–108 MHz band and all AM radio stations transmit in the 535 kHz–1.7 MHz band. The frequency band around 900 MHz is reserved for wireless phone transmissions. A frequency band centered around 2.45 GHz has been set aside for the new Bluetooth technology. Hundreds of other wireless technologies have their own band of the radio spectrum set aside, from baby monitors to deep space communications.

Communications within a given frequency band occur on even more narrowly and precisely defined channels within that band. Hence, in virtually any wireless communication system or device, frequency agility is required and accurate frequency generation is of critical importance. Voltage controlled oscillators (VCOs) can generate a large range of frequencies, but are problematic in that they are unstable and tend to drift. Crystal oscillators, conversely, provide excellent frequency stability but can be used only over the narrow frequency range of the particular quartz crystal contained in the oscillator. A phase-locked loop (PLL) is a commonly used frequency synthesis technique that takes advantage of both the flexibility of a voltage controlled oscillator and the stability of a crystal oscillator.

FIG. 1 depicts a typical frequency synthesis circuit including a PLL 100 and reference crystal oscillator 200. PLL 100 operates in a well-known fashion. Briefly, VCO 108 generates a range of output frequencies via variation of a DC control voltage input to the VCO. The output of VCO 108 is fed back to phase comparator 102, which also receives an input from crystal oscillator 200. The VCO and crystal oscillator inputs to comparator 102 are combined, and any difference in phase/frequency results in a DC voltage output. The output of comparator 102 is coupled back to the input of VCO 108 via charge pump 104 and loop filter 106. The greater the frequency/phase difference that exists between the two signals, the larger the output voltage from comparator 102, and the larger the adjustment that is made to the VCO output frequency. Hence, the output of VCO 108 is driven to, and eventually locks onto, the frequency of crystal oscillator 200. Divider 110 is positioned in the feedback path between VCO 108 and phase comparator 102. It is typically a programmable frequency divider that divides the VCO frequency down to the reference frequency produced by crystal oscillator 200. Hence, a large range of output frequencies can be generated and frequency lock still maintained by manipulation of the divide-by number.

Crystal oscillator 200 uses a quartz crystal to provide a fixed and stable reference frequency. Since temperature affects the rate at which a crystal vibrates, crystal oscillators often include a temperature compensation network that senses the ambient temperature and "pulls" the crystal frequency to prevent frequency drift over a temperature range. A temperature compensated crystal oscillator is referred to as a TCXO. Crystal oscillators, like voltage controlled oscillators, can also be made tunable over the frequency range (albeit much smaller) of the crystal by application of a control voltage. A voltage controlled crystal oscillator is referred to as a VCXO. A crystal oscillator that combines the attributes of voltage control and temperature compensation is referred to as a VC-TCXO.

In recent years, VC-TCXO designs have been required to comply with significantly more demanding specifications. VC-TCXOs are typically required to remain frequency stable to within ±2.5 parts per million (ppm) over a temperature range of −30° C. to +85° C. Moreover, their initial accuracy or tolerance at ambient temperature must be within ±1.5 ppm.

Modern communication devices also impose very high spectral purity and phase noise demands on the VC-TCXO. Phase noise affects the receiver's ability to reject unwanted signals on nearby channels. It is the ratio of the output power divided by the noise power at a specified offset and is expressed in dBc/Hz. The reference frequency produced by a VC-TCXO may be used to phase lock an output frequency that is one-hundred times or more greater. Since phase noise performance is degraded by a factor of 20 log N, where N is the frequency multiplier or divide-by number, close in phase noise performance (i.e. at offsets of less than 100 Hz) exceeding −90 dBc is required.

Close in phase noise performance is especially important in FM systems and in position location systems. In FM systems, close in phase noise directly degrades the audio quality and manifests itself as an audio hiss. In position location systems, such as those used to receive GPS signals, close in phase noise may manifest itself as positional inaccuracy or receiver sensitivity impairment. Receiver sensitivity impairment is due to the short term frequency or phase jitter of the reference oscillator caused by the phase noise, and the subsequent inability of the receiver to accurately correlate for extended periods of time.

To meet these stringent accuracy and close in phase noise requirements, the VC-TCXO topology and components must be chosen with caution. The use of a dedicated integrated circuit (IC), a frequency control element and factory calibration are required. Each of these requirements adds considerable time and cost to production. Currently, only a handful of manufacturers world wide can economically produce VC-TCXOs meeting these requirements that are suitable for use in high volume consumer communication devices.

The Q of the oscillator quartz crystal alone can be as high as 50,000, meaning that additional losses of any significance at all in the resonator network will dramatically reduce the overall Q and seriously degrade close in phase noise performance. One element that is particularly difficult to implement and control without degrading close in phase noise performance is the voltage controlled, frequency-tuning element associated with the crystal. In a VC-TCXO, this element usually takes the form of a voltage dependent capacitor, commonly referred to as a variable capacitance diode, varicap diode or varactor.

The operation of a varactor is well understood. When a reverse voltage is applied to a varactor, the insulation layer between the p-doped and n-doped semiconductor regions thickens. A depletion region that is essentially devoid of carriers forms and behaves as the dielectric of the capacitor. The depletion region increases as the reverse voltage across it increases, and since capacitance varies inversely as dielectric thickness, the junction capacitance decreases as the reverse voltage increases. Capacitance variations effected by control voltage variations effect corresponding variations in the resonant frequency of the oscillator.

Unfortunately, a typical varactor has a relatively low Q due to its intrinsic series resistance, which may be as much as several ohms. The Q of a varactor can be expressed as $X_c/R_s$, where $X_c$ is the reactance of the varactor ($1/[2 \cdot \pi \cdot f \cdot c]$) and $R_s$ is the effective series resistance of the varactor. A capacitance of 5 pF at a frequency of 1.5 GHz results in a reactance $X_c$ of 21.22 $\Omega$. If the effective series resistance $R_s$ of the varactor is 0.5 $\Omega$, the resultant Q is 42.44. When compared to the extremely high Q of the crystal itself, it can be seen how much this will degrade the overall Q of the oscillator. Clearly, the effective series resistance of the varactor poses a problem and a tuning element having less series resistance will have a highly direct and positive impact on the overall Q.

Another problem with use of varactors is their non-linear transfer function (applied voltage versus capacitance). FIG. 2 is a chart plotting the capacitance of a typical varactor versus a common tuning range for this component in a mobile phone (0.3V to 2.7V). As can be seen, it is not a linear relation. Below 0.5V, unit voltage changes lead to much greater unit capacitance changes. Consequently, the MHz/volt frequency shift of the oscillator is not constant across the tuning range.

Another problem associated with the varactor is that, since it is a reverse-biased diode junction, it is important that the applied AC signal does not overcome the bias voltage and result in heavy forward conduction of the diode. If this occurs the Q of the resonator will be dramatically lowered and various oscillator parameters such as phase noise and general spectral purity will be seriously impacted. In extreme cases, the oscillator may fail to maintain a continuous oscillation and degenerate into parasitic uncontrolled burst oscillations.

In view of the above, there is a need for a voltage controlled temperature compensated crystal oscillator employing frequency tuning elements without the attendant drawbacks of degraded phase noise performance and non-linear transfer function.

SUMMARY OF THE INVENTION

The present invention provides a voltage controlled temperature compensated crystal oscillator that incorporates a tunable ferroelectric capacitor to provide better phase noise performance and a more linear voltage/capacitance transfer function.

Accordingly, one embodiment of the invention provides a voltage controlled crystal oscillator. It comprises a crystal for generating a reference frequency, a ferroelectric capacitor having a variable capacitance, and a control line coupled to the ferroelectric capacitor for applying a control voltage to the capacitor. The control voltage varies the capacitance which varies the reference frequency generated by the crystal.

Another embodiment of the invention provides a temperature compensated crystal oscillator. It comprises a crystal for generating a reference frequency, a ferroelectric capacitor having a variable capacitance, a temperature sensor and temperature compensation control circuitry coupled to the temperature sensor and to the ferroelectric capacitor. The control circuitry applies an appropriate correction voltage to the ferroelectric capacitor in response to changes in temperature sensed by the temperature sensor. The correction voltage varies the capacitance of the ferroelectric capacitor which, in turn, varies the reference frequency generated by the crystal.

Another embodiment of the invention provides a crystal oscillator. It comprises a crystal for generating a reference frequency and a ferroelectric capacitor having a capacitance that is adjusted and then fixed during manufacture to set the initial tolerance of the crystal oscillator at ambient temperature.

Another embodiment of the invention provides a voltage controlled temperature compensated crystal oscillator. A fine tuning ferroelectric has a variable capacitance and is coupled to an automatic frequency control line that applies a control voltage to vary the capacitance of the fine tuning capacitor which, in turn, fine tunes the reference frequency generated by the crystal. A temperature compensating ferroelectric capacitor has a variable capacitance and is coupled to a temperature sensor and temperature compensation control circuitry. The control circuitry applies an appropriate correction voltage to the temperature compensating capacitor in response to changes in temperature sensed by the temperature sensor to vary the capacitance of the temperature compensating capacitor which, in turn, varies the reference frequency generated by the crystal in response to ambient temperature changes. A third ferroelectric capacitor has a capacitance that is adjusted and then fixed during manufacture to set the initial tolerance of the crystal oscillator at ambient temperature.

Other features, objects and implementations of the invention will be or will become apparent to one with skill in the art upon examination of the following figures and detailed description. All such additional features, objects and implementations are intended to be included within this description, to be within the scope of the invention and to be protected by the accompanying claims.

DETAILED DESCRIPTION OF THE INVENTION

Figure 1:
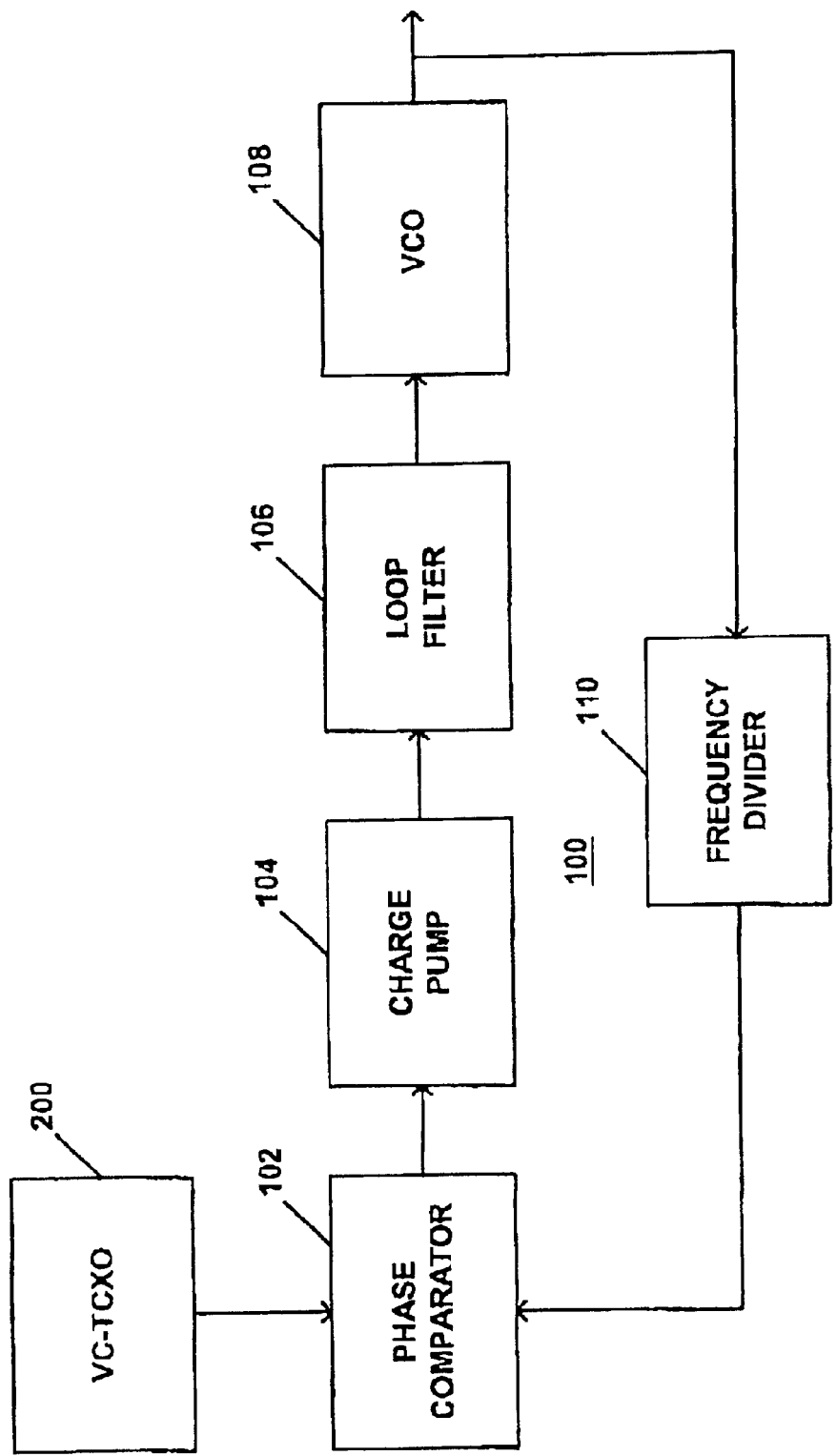
FIG. 1 is a schematic of a conventional frequency synthesis circuit including a phase-locked loop and a temperature compensated voltage controlled crystal oscillator.
Figure 2:
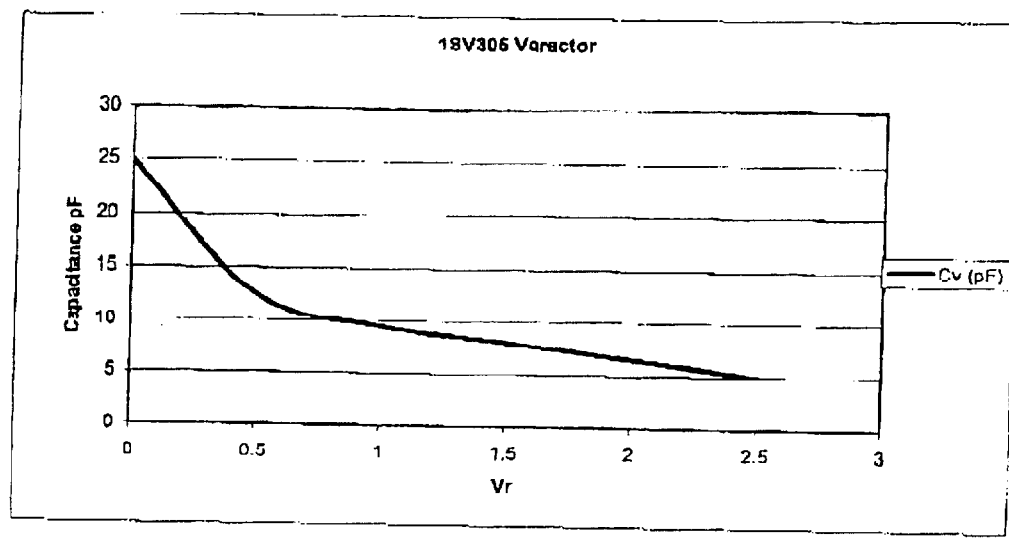
FIG. 2 is a graph plotting capacitance versus applied control voltage for a typical varactor.

Crystal oscillators currently in use typically employ varicap diodes or varactors as the frequency tuning device. These oscillators exhibit compromised phase noise performance and non-linear capacitance/control voltage transfer functions. In order to overcome these shortcomings, the present invention provides an oscillator employing a ferroelectric capacitor, rather than a varicap diode, as the tuning device. Ferroelectric capacitors may be provided in the crystal oscillator for any or all of voltage control, temperature compensation and/or setting the initial tolerance of the capacitor.

The background, advantages, topologies and test methods associated with ferroelectric capacitors are fully set forth in commonly owned U.S. provisional application serial No. 60/283,093 filed on Apr. 11, 2001, as well as commonly owned related U.S. application Ser. Nos. 09/904,631 filed on Jul. 13, 2001, by Stanley S. Toncich entitled "Ferro-Electric Tunable Filter"; 09/912,753 filed on Jul. 24, 2001 by Stanley S. Toncich entitled "Tunable Ferro-Electric Multiplexer"; 09/927,732 filed on Aug. 8, 2001, by Stanley S. Toncich entitled "Low Loss Tunable Ferro-Electric Device and Method of Characterization"; 09/927,136 filed on Aug. 10, 2001, by Stanley S. Toncich entitled "Tunable Matching Circuit"; 10/044,522 filed on Jan. 11, 2002, by Stanley S. Toncich entitled "Tunable Planar Capacitor"; 10/077,654 filed on Feb. 14, 2002, by Stanley S. Toncich entitled "Tunable Isolator Matching Circuit"; 10/076,171 filed on Feb. 12, 2002, by Stanley S. Toncich entitled "Antenna Interface Unit"; 10/075,896 filed Feb. 12, 2002, by Stanley S. Toncich entitled "Tunable Antenna Matching Circuit"; 10/075,727 filed Feb. 12, 2002, by Stanley S. Toncich and Tim Forrester entitled "Tunable Low Noise Amplifier"; 10/075,507 filed on Feb. 12, 2002, by Stanley S. Toncich entitled "Tunable Power Amplifier Matching Circuit", which are hereby incorporated by reference. Briefly, these applications disclose test methods utilizing narrowband resonant circuits that accurately measure and characterize the loss due to use of a ferroelectric material, and establish that ferroelectric components are not as lossy as previously thought. Previous testing methods and devices did not account for all loss mechanisms and it was therefore not possible to accurately determine the loss due to use of ferroelectric material. In one implementation, the narrowband resonant circuit used for testing is a microstrip resonator having a gap to define the capacitor, and a ferroelectric film deposited in the gap.

By employing proper testing methods and loss accounting mechanisms, tunable ferroelectric components can be optimized and designed for use in a wide variety of low loss applications and frequency agile circuits. The choice of topology is critical for attaining the best possible Q (lowest losses). Depending on the particular topology and materials that are employed, and the applicable frequency range, Qs of greater than 80, greater than 180 and even higher are attainable. Design procedures and implementation details are set forth for gap capacitors, overlay capacitors and interdigital capacitors. The lowest losses are achieved by direct fabrication of the ferroelectric capacitor to the resonator or other RF circuitry. This eliminates added losses caused by attachment of the ferroelectric capacitor to a circuit.

Figure 4:
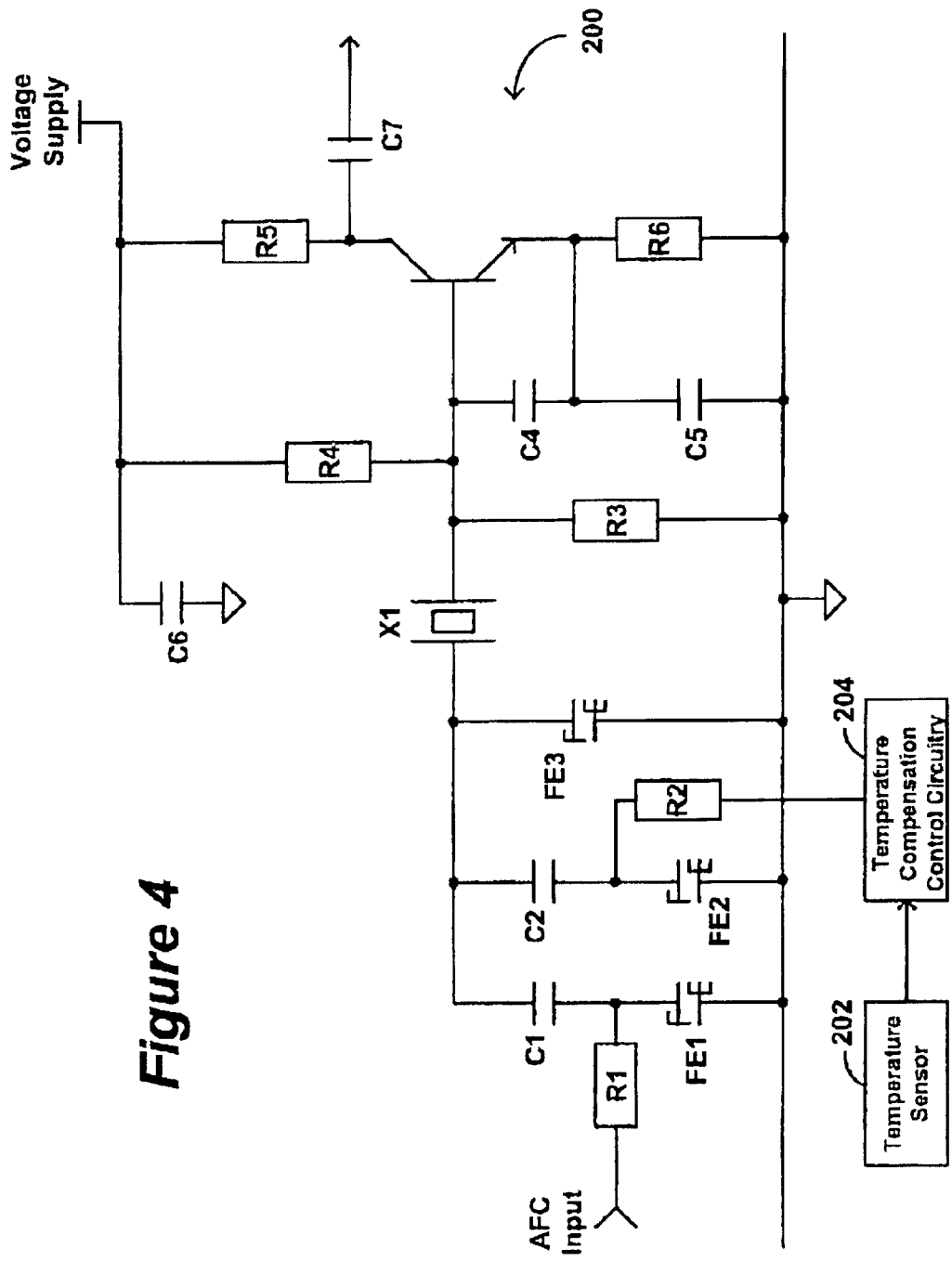
FIG. 4 is a schematic of a ferroelectric tuned voltage controlled temperature compensated crystal oscillator according to the present invention.

FIG. 4 depicts a ferroelectric tuned voltage controlled temperature compensated crystal oscillator (VC-TCXO) 200 according to the present invention. VC-TCXO 200 has a layout similar to that of a conventional VC-TCXO design, but differs in that it employs ferroelectric components rather than varactors as the voltage controlled tuning devices. At least one ferroelectric component, and as many as three or more ferroelectric components, are utilized. VC-TCXO 200 illustrated in FIG. 4 includes three ferroelectric capacitors FE1, FE2 and FE3.

Figure 3:
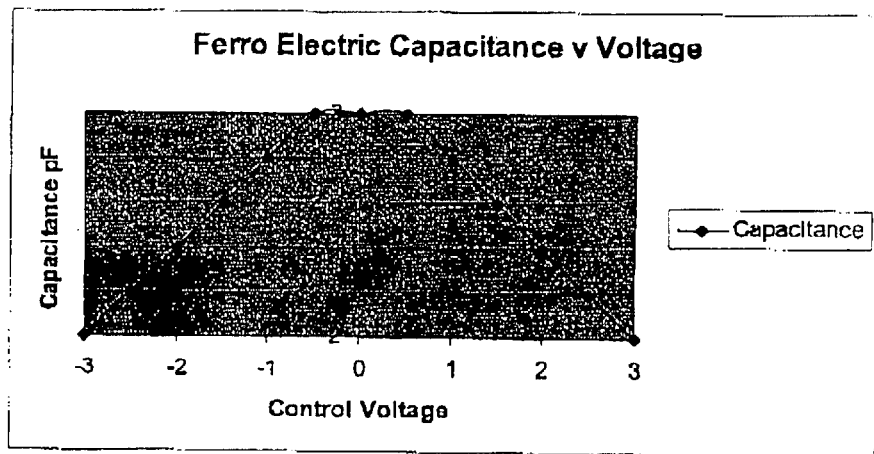
FIG. 3 is a graph plotting capacitance versus applied control voltage for a ferroelectric capacitor according to the present invention.

A variable ferroelectric capacitor has several advantages over a varicap diode. First, it has a much lower series resistance, typically by a factor of ten. This will directly result in a higher Q ($Q=X_c/R_s$, see discussion above) and better phase noise performance. Secondly, as plotted in FIG. 3, the capacitance/applied voltage transfer function of a ferroelectric capacitor is essentially linear, thereby permitting the design of more optimum PLL loop filters. Finally, ferroelectric capacitors do not suffer from the forward bias conduction problems of varicap diodes.

The first potential use of a ferroelectric capacitor in a VC-TCXO is for automatic frequency control (AFC), that is, accurate control of the frequency produced by the VC-TCXO. This is also sometimes referred to as fine control or trimming of the oscillator frequency. Ferroelectric capacitor FE1 in VC-TCXO 200 is provided for fine or automatic frequency control. As can be seen in FIG. 4, an AFC input voltage is applied to ferroelectric capacitor FE1 (via resistance R1). By varying the AFC input voltage, and hence the voltage applied to FE1, the capacitance of FE1 and thus the operating frequency of oscillator 200 is changed. The AFC input voltage may also be used in conjunction with capacitor FE1 to manually trim out any remaining initial tolerance error at ambient temperature.

The second potential use of a ferroelectric capacitor in a VC-TCXO is in conjunction with the temperature compensation function. VC-TCXO 200 comprises temperature compensation control circuitry 204. Based on ambient temperature measurements provided by temperature sensor 202 (a thermistor, or the like), control circuitry 204 applies an appropriate correction voltage to ferroelectric capacitor FE2, which in turn affects the capacitance of FE2 and hence the operating frequency of oscillator 200. Temperature compensation control circuitry may function in an analog or digital manner, but the end result is an analog voltage applied to FE2. In the digital case, which is the most common, a particular digital word is generated by control circuitry 204 for a certain range of temperatures measured by sensor 202 (typically a five degree window). The digital word is provided to a digital to analog converter (either contained in circuitry 204 or interposed between circuitry 204 and FE2), which then applies a corresponding analog control voltage to FE2.

The third potential use of a ferroelectric capacitor in a VC-TCXO is for adjustment of the initial tolerance of the oscillator at ambient temperature. Typically, the initial tolerance is adjusted to within ±2 ppm of the nominal frequency. In VC-TCXO 200, ferroelectric capacitor FE3 provides this function. In one implementation, FE3 is under the control of a simple digital to analog converter (not shown) whose value is set at the time of manufacture. This value is set in memory before any temperature compensation data is written by circuitry 204.

The use of ferroelectric components in VC-TCXO 200, in addition to providing a higher Q and better phase noise performance as described above, is also advantageous in that it results in a much higher device yield. Presently, during VC-TCXO manufacture, a number of fixed value capacitors are installed (a fixed value capacitor is conventionally used in place of ferroelectric capacitor FE3, for example) and tested in turn to set the initial frequency. Due to re-work issues, a capacitor value can be changed only two or three times before the whole VC-TCXO is rejected. The rejected VC-TCXOs add directly to the cost of those VC-TCXOs which pass all tests. By using ferroelectric tuning components rather than fixed value capacitors, this problem is essentially removed and a much higher yield results. Also, since ferroelectric components are electrically tuned rather than adjusted by manual or automated component replacement, the process of trimming the VC-TCXO is much quicker and further contributes to a lower unit cost.

Another advantage provided by the use of ferroelectric components is the ability to integrate more components onto the silicon chip. In a typical VC-TCXO, the crystal X1 and the fixed value capacitor employed (in place of ferroelectric capacitor FE3) cannot be integrated onto the chip. As described above, the fixed value capacitor is subject to an installation, testing and removal process and hence cannot be integrated with the rest of the circuit. Typically, the varactor diodes used (rather than ferroelectric capacitors FE1 and FE2) are not integrated onto the chip either.

In VC-TCXO 200, conversely, it is entirely feasible to integrate all components onto the silicon chip (with the exception of crystal X1). The ferroelectric material employed in capacitors FE1, FE2 and FE3 can be deposited during the normal integrated circuit fabrication process since the FE deposition process is only a few microns thick and is compatible with existing microchip manufacturing processes. Although the ferroelectric tuning devices could be installed as stand alone components, it is preferred that they be integrated onto the chip. As described in the related applications referenced herein, integration of the ferroelectric components directly into the circuit reduces the loss that arises due to the connection process.

Other embodiments and implementations of the invention will be or will become apparent to one with skill in the art. All such additional embodiments and implementations are intended to be included within this description, to be within the scope of the invention and to be protected by the accompanying claims.

What is claimed is:

1. A voltage controlled crystal oscillator comprising:
a crystal for generating a reference frequency;
a ferroelectric capacitor having a variable capacitance;
a control line coupled to the ferroelectric capacitor for applying a control voltage to the capacitor, the control voltage varying the capacitance which, in turn, varies the reference frequency generated by the crystal; and
wherein the control voltage has a linear relation to the capacitance across the tuning range of the capacitor.

2. A voltage controlled crystal oscillator as claimed in claim 1, wherein the crystal oscillator exhibits close in phase noise performance exceeding −90 dBc.

3. A voltage controlled crystal oscillator comprising:
a crystal for generating a reference frequency;
a ferroelectric capacitor having a variable capacitance;
a control line coupled to the ferroelectric capacitor for applying a control voltage to the capacitor, the control voltage varying the capacitance which, in turn, varies the reference frequency generated by the crystal;
a second ferroelectric capacitor;
a temperature sensor; and
temperature compensation control circuitry coupled to the temperature sensor and to the second ferroelectric capacitor, the control circuitry applying an appropriate correction voltage to the second ferroelectric capacitor in response to changes in temperature sensed by the temperature sensor, the correction voltage varying the capacitance of the second ferroelectric capacitor which, in turn, varies the reference frequency generated by the crystal.

4. A voltage controlled crystal oscillator as claimed in claim 3, wherein the ferroelectric capacitors are integrated onto a silicon chip.

5. A temperature compensated crystal oscillator comprising
a crystal for generating a reference frequency;
a ferroelectric capacitor having a variable capacitance;
a temperature sensor; and
temperature compensation control circuitry coupled to the temperature sensor and to the ferroelectric capacitor, the control circuitry applying an appropriate correction voltage to the ferroelectric capacitor in response to changes in temperature sensed by the temperature sensor, the correction voltage varying the capacitance of the ferroelectric capacitor which, in turn, varies the reference frequency generated by the crystal.

6. A temperature compensated crystal oscillator as claimed in claim 5, wherein the temperature compensation control circuitry generates digital words corresponding to ranges of temperature sensed by the temperature sensor, and wherein the control circuitry further comprises a digital to analog converter for converting the digital word to the correction voltage to be applied to the ferroelectric capacitor.

7. temperature compensated crystal oscillator as claimed in claim 5, and further comprising a second ferroelectric capacitor configured to adjust the initial tolerance of the oscillator at ambient temperature.

8. A temperature compensated crystal oscillator as claimed in claim 7, wherein the ferroelectric capacitors are integrated onto a silicon chip.

9. A crystal oscillator comprising:
a crystal for generating a reference frequency;
a ferroelectric capacitor having a capacitance that is adjusted and then fixed during manufacture to set the initial tolerance of the crystal oscillator at ambient temperature; and
a digital to analog converter programmed to a value that is set at the time of manufacture and being coupled to the ferroelectric capacitor so that the capacitance of the ferroelectric capacitor is a constant reflective of the initial tolerance.

10. A crystal oscillator comprising:
a crystal for generating a reference frequency;
a ferroelectric capacitor having a capacitance that is adjusted and then fixed during manufacture to set the initial tolerance of the crystal oscillator at ambient temperature;

a second ferroelectric capacitor having a variable capacitance; and a control line coupled to the second ferroelectric capacitor for applying a control voltage to the capacitor, the control voltage varying the capacitance which, in turn, fine tunes the reference frequency generated by the crystal.

11. A crystal oscillator as claimed in claim 10, wherein the ferroelectric capacitors are integrated onto a silicon chip.

12. A voltage controlled temperature compensated crystal oscillator comprising:

a crystal for generating a reference frequency;

a fine tuning ferroelectric capacitor having a variable capacitance;

an automatic frequency control line coupled to the fine tuning ferroelectric capacitor for applying a control voltage to the fine tuning capacitor, the control voltage varying the capacitance of the fine tuning capacitor which, in turn, fine tunes the reference frequency generated by the crystal;

a temperature compensating ferroelectric capacitor having a variable capacitance;

a temperature sensor;

temperature compensation control circuitry coupled to the temperature sensor and to the temperature compensating capacitor, the control circuitry applying an appropriate correction voltage to the temperature compensating capacitor in response to changes in temperature sensed by the temperature sensor, the correction voltage varying the capacitance of the temperature compensating capacitor which, in turn, varies the reference frequency generated by the crystal in response to ambient temperature changes; and a third ferroelectric capacitor having a capacitance that is adjusted and then fixed during manufacture to set the initial tolerance of the crystal oscillator at ambient temperature.

13. A voltage controlled temperature compensated crystal oscillator as claimed in claim 12 that exhibits close in phase noise performance exceeding −90 dBc.

14. A voltage controlled temperature compensated crystal oscillator as claimed in claim 12, wherein the temperature compensation control circuitry generates digital words corresponding to ranges of temperature sensed by the temperature sensor, and wherein the control circuitry further comprises a digital to analog converter for converting the digital word to the correction voltage to be applied to the temperature compensating ferroelectric capacitor.

15. A voltage controlled temperature compensated crystal oscillator as claimed in claim 12, wherein the initial tolerance is adjusted to within ±2 ppm of the reference frequency, and further comprising a digital to analog converter programmed to a value that is set at the time of manufacture and that is coupled to the third ferroelectric capacitor so that the capacitance of the third ferroelectric capacitor is a constant reflective of the initial tolerance.

16. A voltage controlled temperature compensated crystal oscillator as claimed in claim 12, wherein all ferroelectric capacitors are directly integrated onto a silicon chip.

* * * * *